(12) United States Patent
McCulloch

(10) Patent No.: US 6,169,014 B1
(45) Date of Patent: Jan. 2, 2001

(54) LASER CRYSTALLIZATION OF THIN FILMS

(75) Inventor: David J. McCulloch, Redhill (GB)

(73) Assignee: U.S. Philips Corporation, New York, NY (US)

( * ) Notice: Under 35 U.S.C. 154(b), the term of this patent shall be extended for 0 days.

(21) Appl. No.: 09/379,060

(22) Filed: Aug. 23, 1999

(30) Foreign Application Priority Data

Sep. 4, 1998 (GB) .................................................. 9819338

(51) Int. Cl.$^7$ .................................................. H01L 21/20
(52) U.S. Cl. .................... 438/487; 438/166; 438/487; 438/486; 438/482; 257/70
(58) Field of Search .................... 438/487, 486, 438/482, 166; 148/174; 257/69–70

(56) References Cited

U.S. PATENT DOCUMENTS

| | | | |
|---|---|---|---|
| 3,585,088 | * 6/1971 | Schwuttke et al. | 148/174 |
| 3,600,237 | * 8/1971 | Davis et al. | 148/1.6 |
| 4,309,225 | * 1/1982 | Fan et al. | 148/1.5 |
| 4,330,363 | * 5/1982 | Biegelsen et al. | 156/620 |
| 4,400,715 | * 8/1983 | Barbee et al. | 357/49 |
| 4,604,791 | * 8/1986 | Todorof | 29/581 |
| 6,014,944 | * 1/2000 | Aklufi et al. | 118/723 |

FOREIGN PATENT DOCUMENTS

9745827 * 12/1997 (WO) .

OTHER PUBLICATIONS

A Novel Double–Puse Excimer–Laser Crystallization Method of Silicon Thin–Filsm, Ishihara et al, Japanese Journal of Applied Physics, Part 1, vol. 34, No. 8a, Aug. 1995 pp. 3976–3981.*

"Single–crystal Si Films Via a Low–Substrate–Temperature Excimer–Laser Crystallization Method" by Robert S. Sposili, M.A. Crowder and James S. Im in Mat. Res. Soc. Symp. Proc. vol. 452, pp. 953–958, 1997 Materials Research Society.

"A Novel Double–Pulse Excimer–Laser Crystallization Method of Silicon Thin–Films" by Ryoichi Ishihara and Masakiyo Matsumura, in Jpn. J. Appl. Phys. vol. 34 (1995) pp. 3976–3981,, Part 1, No. 81, Aug. 1995.

* cited by examiner

Primary Examiner—Matthew Smith
Assistant Examiner—Granvill D. Lee, Jr.
(74) Attorney, Agent, or Firm—John C. Fox

(57) ABSTRACT

A laser crystallization method comprises the steps of providing a film of semiconductor material on an insulating substrate, and scanning a pulsed laser beam over the film, the laser beam being shaped to define a chevron. Each pulse of the laser beam comprises at least a first pulse portion of a first energy and a second subsequent pulse portion of a second energy. The first and second pulse portions of each pulse are applied at substantially the same position over the film. This method is used to form electronic devices and enables reliable crystallization to form large single crystal areas in thin semiconductor films.

9 Claims, 2 Drawing Sheets

LASER CRYSTALLIZATION OF THIN FILMS

BACKGROUND OF THE INVENTION

This invention relates to laser crystallization of thin films. Crystallization of silicon films has been used extensively in order to produce high performance active matrix liquid crystal displays and other devices. A particular advantage of the use of laser crystallization is that polysilicon thin film transistors can be fabricated on glass substrates, without introducing thermal damage to the glass substrate.

Various measures have been proposed in order to increase the grain size of laser crystallized silicon films, so as to reduce the number of grain boundaries occurring in devices formed from the silicon film. The article "Single-Crystal Si Films Via A Low-Substrate-Temperature Excimer-Laser Crystallization Method" in Mat. Res. Soc. Symp. Proc. Vol. 452 pp.953–958 by R. S. Sposili, et. al. describes the use of a chevron-shaped laser beam profile for the crystallization of silicon to form single-crystal regions at predetermined locations on thin silicon films. The contents of this article are incorporated herein as reference material. The described method is applied to a film of silicon having a thickness of 200 nm, and the method may practically be applied for film thicknesses down to approximately 100 nm. For thicknesses below this level self-nucleation within the film results in reduction in the grain size.

It is desirable to reduce the film thickness of the semiconductor layer for various reasons. A lower thickness results in a more rapid laser crystallization process, because a thicker semiconductor film requires more energy to melt the film. As a result, for a given energy of laser source, a smaller area of the film can be treated using the laser source. Furthermore, a thinner semiconductor film has reduced light sensitivity, which may be desirable for certain semiconductor devices.

SUMMARY OF THE INVENTION

According to a first aspect of the invention, there is provided a method of manufacturing an electronic device comprising a semiconductor component having a thin film semiconductor layer provided on an insulating substrate, wherein the semiconductor layer is crystallized by scanning a pulsed laser beam over the film, the laser beam being shaped to define a chevron, each pulse of the laser beam comprising at least a first pulse portion of a first energy and a second subsequent pulse portion of a second energy, at least the first and second pulse portions of each pulse being applied at substantially the same position over the film. Each pulse of the chevron-shaped beam may comprise more than two pulse portions. Thus, each pulse may comprise successive pulse portions of different energies which are applied at substantially the same position over the film.

The use of a chevron-shaped crystallization beam enables the grain size of single crystal regions in the semiconductor film to be increased. Furthermore, the use of the multiple-pulse laser reduces the tendency to self-nucleation within the semiconductor film. This enables the crystallization method to be employed for film thicknesses below 100 nm, and preferably for film thicknesses of approximately 40 nm.

The invention also provides a laser crystallization method for crystallizing a thin film semiconductor layer, comprising the steps of:

providing a film of semiconductor material on an insulating substrate;

scanning a pulsed laser beam over the film, the laser beam being shaped to define a chevron, each pulse of the laser beam comprising at least a first pulse portion of a first energy and a second subsequent pulse portion of a second energy, at least the first and second pulse portions of each pulse being applied at substantially the same position over the film.

A double-pulse laser crystallization method is known from the article "A Novel Double-Pulse Excimer-Laser Crystallization Method of Silicon Thin-Films" in Jpn. J. Appl. Phys. Vol 34 (1995) pp 3976–3981 by R. Ishihara et. al., and the method is described as increasing the grain size of excimer-laser crystallized silicon films, particularly so that a single split pulse can produce crystallization of a 1 micrometer region of film material. The contents of this article are also incorporated herein as reference material.

The invention also provides a laser crystallization apparatus comprising:

a pulsed laser source providing laser beam pulses;

an optical processing system for splitting the laser beam pulses to provide output pulses having an intensity profile defining at least a first pulse portion of a first energy and a second subsequent pulse portion of a second energy;

means for shaping the output pulses to form chevron-shaped pulses; and a projection system for projecting the chevron-shaped pulses onto a sample for crystallization.

BRIEF DESCRIPTION OF THE DRAWING

Embodiments of the invention will now be described by way of example with reference to the accompanying drawings, in which.

DESCRIPTION OF THE PREFERRED EMBODIMENTS

Figure 1:
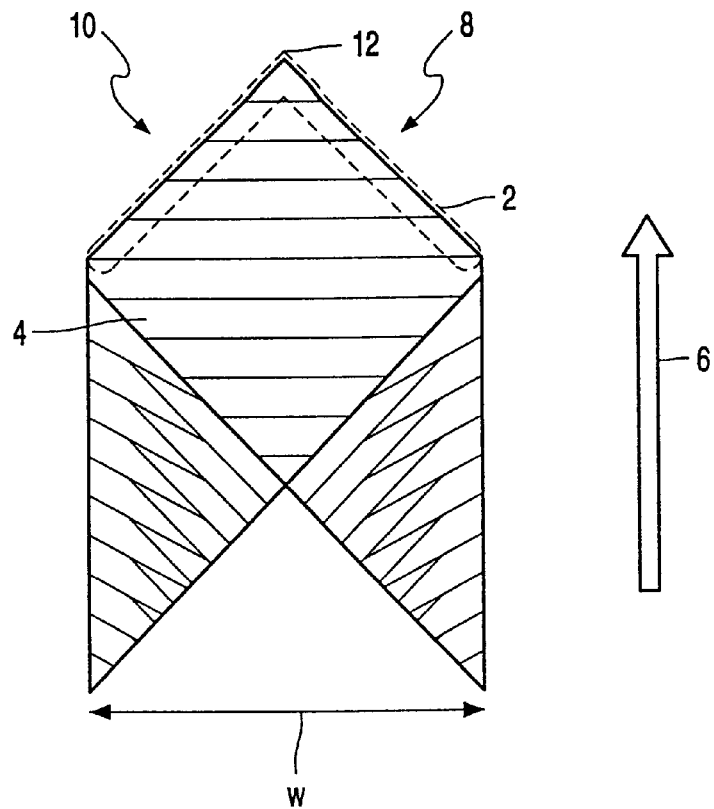
FIG. 1 shows the grain boundaries defined by a pulse laser applied to an amorphous semiconductor film, with the pulse applied through a chevron shaped mask.

As shown in FIG. 1, the solidification front for a laser crystallization technique according to the invention is defined as a chevron-shaped beam 2 which grows a single crystal grain at the apex of the chevron. The single crystal grain grows as the beam is advanced over the film. This beam shape enables large single-crystal regions to be defined within a semiconductor layer and which can be positioned to coincide with the desired locations for semiconductor devices to be formed from the film, for example thin film transistors. Each pulse of the beam comprises two pulse portions, for example having the intensity-time profile represented in FIG. 3 part B. This double-pulse method enables the thickness of films which can be processed using the invention to be reduced to the optimum levels for amorphous silicon semiconductor layers, for example 40 nm.

The method of the invention is applicable to laser crystallization methods, which enable the conversion of amorphous or polycrystalline silicon films into directionally solidified microstructures. The crystallization method involves complete melting of the selected regions of the semiconductor film using irradiation through a patterned mask, combined with controlled movement of the film relatively to the mask between pulses. For a given energy output of the laser source of the crystallization apparatus, a thinner film thickness enables the rate at which the patterned laser is scanned over the film to be increased.

FIG. 1 illustrates the crystallization caused by advancing a laser heating beam patterned using a chevron-shaped aperture over the film of semiconductor material. The use of a chevron shaped mask 2 causes a single crystal grain to be formed at the apex of the chevron, which then experiences lateral growth not only in the translation direction (arrow 6 in FIG. 1) but also transversely, due to the fact that the grain boundaries form approximately perpendicularly to the melt interface. Advancing the chevron shaped beam over the thin film semiconductor layer results in the single-crystal region 4 as shown in FIG. 1 part B in the manner described in the article "Single-Crystal Si Films Via Low-Substrate-Temperature Excimer-Laser Crystallisation Method" referred to earlier in this application.

The chevron-shaped beam may have a width (W) of the order of ones or tens of microns, so that the resulting single crystal region is sufficient in size to correspond to the channel region of a thin film transistor to be fabricated using the thin film semiconductor layer. The width of the slit defining the beam shape may be approximately 1 $\mu$m.

The laser may be patterned to define an array of the chevron-shaped beams so that the crystallized film includes an array of single crystal regions. The chevron-shaped beam defines first and second solidification fronts 8, 10 which meet at an apex 12. These fronts are not necessarily perpendicular, and an acute angle or an obtuse angle may be subtended at the apex. These possibilities are each intended to fall within the term "chevron" as used in this description and the claims.

Lateral solidification of the semiconductor material melted by the laser heating is optimised when the laser heating results in complete melting of the full depth of the thin film. A sufficiently high laser energy density is required to achieve this which will depend on the film characteristics. A pulsed excimer laser is appropriate for this purpose.

The laser crystallization method of the invention also employs a laser pulse intensity profile having two or more sequential intensity peaks. The use of double-pulse excimer laser crystallization has already been proposed to increase the grain size of single crystal regions. The double-pulse method has been understood to slow the cooling rate, so that the crystalline nuclei can grow to a sufficient size to meet each other before the onset of copious homogeneous nucleation which is known to occur at about 500° C. of undercooling. The first pulse causes the film to melt, and a sufficient time period is provided before the second pulse to allow thermal diffusion into the substrate. This pre-heating of the substrate reduces the cooling rate after the second pulse.

Figure 3A:
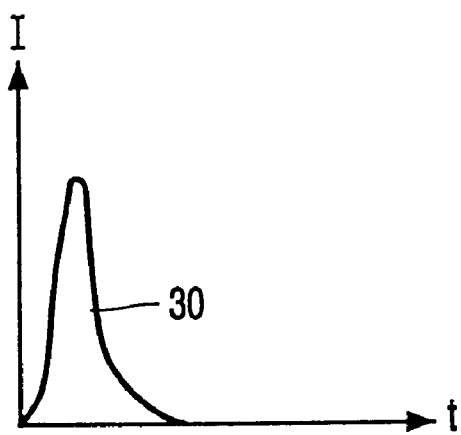
FIG. 3 shows the laser beam intensity pattern at locations IIIA and IIIB within the apparatus of FIG. 2.
Figure 3B:
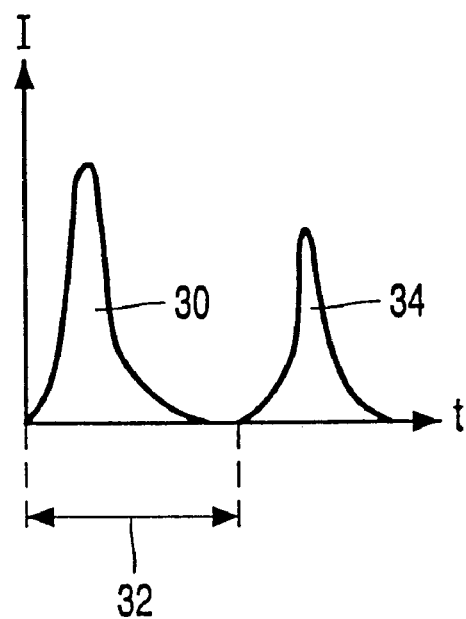

An example of the possible intensity profile is shown in FIG. 3 part B. The first pulse 30 has a sufficient energy to density to melt completely the film, and this energy density will depend on the nature and thickness of the film being treated by the process. The energy density may be of the order of 300 mJ/cm$^2$, for an amorphous silicon thin film having a thickness of 50 nm. The pulse duration may be of the order of 30 ns. The delay 32 between the pulses is sufficient to allow a significant diffusion of heat into the substrate, yet not sufficient to allow copious homogenious nucleation of the unsolidified portion of the film, and for example may be between 100 and 200 ns. Less energy will be required from the second pulse 34 may have an energy density of 150 mJ/cm$^2$ in the example shown. The purpose of the second pulse is cause the solidification process to start again.

The exact profile of the laser pulse intensity profile will be selected taking numerous considerations into account, such as the chemical composition and the mechanical structure of the film. The invention has been described in the context of producing polycrystalline silicon films from amorphous silicon deposited layers, although the invention is equally applicable to laser crystallization of other materials.

Figure 2:
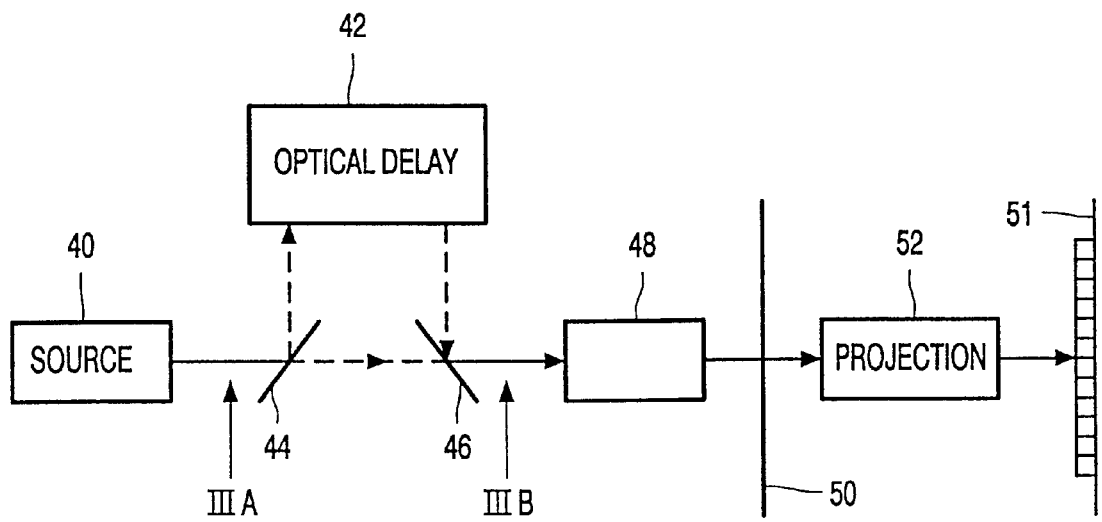
FIG. 2 shows laser crystallization apparatus according to the invention.

FIG. 2 shows a laser crystallization apparatus according to the invention. A pulse laser source 40 provides laser beam pulses, for example having the profile shown in FIG. 3 Part A. An optical processing system 42 provides the multiple peak intensity profile of which an example is shown in FIG. 3 Part B (in which each pulse includes a first pulse portion of a first energy and a second subsequent pulse portion of a second energy). This system 42 receives the laser source output from a beam splitter 44, which is partially transmissive and partially reflective. An optical delay is provided by the processing system 42, as well as attenuation of the light signal if desired. Using a combiner 46, the delayed signal is combined with the part of the original source output transmitted by the beam splitter 44.

The double pulse laser beam output is supplied to a homogeniser 48 for conversion from a semi-gaussian profile to a top-hat profile.

As one possibility, a mask 50 is provided for shaping the output pulses to form the chevron-shaped pulses, for subsequent transmission to the sample 51, using a projection system 52.

The sample (comprising the film 51 on its insulating substrate) is mounted on a movable platform so that the projected beam can be caused to scan over the sample.

What is claimed is:

1. A method of manufacturing an electronic device comprising a semiconductor component having a thin film semiconductor layer provided on an insulating substrate, wherein the semiconductor layer is crystallized by scanning a pulsed laser beam over the film, the laser beam being shaped to define a chevron, each pulse of the laser beam comprising at least a first pulse portion of a first energy and a second subsequent pulse portion of a second energy, at least the first and second pulse portions of each pulse being applied at the substantially same position over the film.

2. A method as claimed in claim 1, wherein the semiconductor component comprises a thin film transistor.

3. A method as claimed in claim 1, wherein thickness of the film is less than 100 nm.

4. A method as claimed in claim 3, wherein thickness of the film is approximately 40 nm.

5. A method as claimed claim 1, wherein the first energy is greater than the second energy.

6. A method as claimed in claim 1, wherein the film of semiconductor material comprises amorphous silicon.

7. A laser crystallization method for crystallizing a thin film semiconductor layer, comprising the steps of:

providing a film of semiconductor material on an insulating substrate; and scanning a pulsed laser beam over the film, the laser beam being shaped to define a chevron, each pulse of the laser beam comprising at least a first pulse portion of a first energy and a second subsequent pulse portion of a second energy, at least the first and second pulse portions of each pulse being applied at substantially the same position over the film.

8. A laser crystallization device comprising:

a pulsed laser source providing laser beam pulses;

an optical processing system for splitting the laser beam pulses to provide output pulses having an intensity profile defining at least a first pulse portion of a first energy and a second subsequent pulse portion of a second energy;

means for shaping the output pulses to form chevron-shaped pulses; and a projection system for projecting the chevron-shaped pulses onto a sample for crystallization.

9. A laser crystallization device as claimed in claim 8, further comprising means for scanning the output pulses across the sample.

* * * * *